United States Patent [19]
Jeon

[11] Patent Number: 6,087,244
[45] Date of Patent: Jul. 11, 2000

[54] METHODS OF FORMING SEMICONDUCTOR-ON-INSULATOR DEVICES INCLUDING BURIED LAYERS OF OPPOSITE CONDUCTIVITY TYPE

[75] Inventor: Chang-Ki Jeon, Kyungki-do, Rep. of Korea

[73] Assignee: Fairchild Korea Semiconductor, Ltd., Kyungki-do, Rep. of Korea

[21] Appl. No.: 09/300,115

[22] Filed: Apr. 27, 1999

Related U.S. Application Data

[62] Division of application No. 08/900,482, Jul. 25, 1997, abandoned.

[30] Foreign Application Priority Data

Oct. 17, 1996 [KR] Rep. of Korea ................. 96-46530

[51] Int. Cl.[7] ............................................. H01L 21/76
[52] U.S. Cl. ..................... 438/426; 438/426; 438/938; 438/227
[58] Field of Search ..................... 438/426, 432, 438/227, 232, 938; 257/508, 520, 501

[56] References Cited

U.S. PATENT DOCUMENTS

| | | | |
|---|---|---|---|
| 4,454,646 | 6/1984 | Joy et al. | 29/576 |
| 4,454,647 | 6/1984 | Joy et al. | 29/576 |
| 4,889,832 | 12/1989 | Chatterjee | 437/203 |
| 4,900,689 | 2/1990 | Bajor et al. | 437/31 |
| 4,920,065 | 4/1990 | Chin et al. | 437/52 |
| 5,171,702 | 12/1992 | Prengle et al. | 437/59 |
| 5,241,211 | 8/1993 | Tashiro | 257/506 |
| 5,496,764 | 3/1996 | Sun | 437/67 |
| 5,668,397 | 9/1997 | Davis et al. | 257/520 |
| 5,705,425 | 1/1998 | Miura et al. | 437/182 |
| 5,872,044 | 2/1999 | Hemmenway et al. | 438/426 |
| 5,920,108 | 7/1999 | Hemmenway et al. | 257/508 |

*Primary Examiner*—Charles Bowers
*Assistant Examiner*—Laura M Schillinger
*Attorney, Agent, or Firm*—MyersBigel Sibley & Sajovec; Mitchell Bigel

[57] ABSTRACT

Semiconductor-on-insulator (SOI) devices are fabricated by forming first and second semiconductor layers of opposite conductivity types, at a first face of a substrate. An insulating layer is formed on the first and second semiconductor layers. A trench is formed through the insulating layer extending between the first and second semiconductor layers and extending into the substrate. A portion of the substrate is removed from a second face which is opposite the first face, to define respective first and second active regions on the respective first and second semiconductor layers.

7 Claims, 6 Drawing Sheets

METHODS OF FORMING SEMICONDUCTOR-ON-INSULATOR DEVICES INCLUDING BURIED LAYERS OF OPPOSITE CONDUCTIVITY TYPE

This is a divisional application of application Ser. No. 08/900,482 filed Jul. 25, 1997, now abandoned.

FIELD OF THE INVENTION

This invention relates to semiconductor devices and manufacturing methods, and more particularly to semiconductor-on-insulator devices and fabrication methods.

BACKGROUND OF THE INVENTION

Semiconductor-on-insulator (SOI) devices are widely used in microelectronics. In general, SOI devices include active devices such as transistors in a thin semiconductor layer which is on an insulator. In contrast, bulk semiconductor devices include active devices such as transistors in a bulk semiconductor region. SOI devices often use a layer of monocrystalline silicon as a semiconductor material. These devices are often referred to as silicon-on-insulator devices.

Referring to FIGS. 1A–1E, a conventional fabrication method for an SOI device will be described. As shown in FIG. 1A, N- or P-type dopants are implanted and diffused into a first substrate 1, at a high doping concentration, to form a buried layer 3. As shown in FIG. 1B, an insulating layer 5 such as an oxide film, is formed on the first substrate 1. As shown in FIG. 1C, a second substrate 7 which is generally not doped, is bonded on the oxide film 5.

As shown in FIG. 1D, the first substrate 1 is ground, etched or polished to a predetermined thickness. As shown in FIG. 1E, an oxide film is formed on the polished surface of the first substrate 1 and patterned to form a mask. The first substrate 1 and the buried layer 3 are etched, using the oxide film as a mask, to form a trench 9. The trench preferably extends to the insulating layer 5. Regions between the trenches are active regions A, where active devices such as transistors are formed. An oxide film 11 is then formed in the trenches 9, for example by thermal oxidation.

Unfortunately, microelectronic circuits often employ transistors of opposite conductivity types which may be desirably formed in active layers of different conductivity types. It may be difficult to vary the conductivity type in different regions of the buried layer 3. Moreover, it ions are selectively implanted, or the insulator 5 is selectively etched, it may difficult to align elements to these regions in subsequent processing steps.

SUMMARY OF THE INVENTION

It is therefore an object of the present invention to provide improved SOI devices and methods of fabricating the same.

It is another object of the present invention to form SOI devices which may include buried layers of opposite conductivity types.

These and other objects are provided, according to the present invention, by an SOI device which includes first and second spaced apart layers of opposite conductivity type on an insulating layer, wherein the first and second spaced apart layers of opposite conductivity type are electrically isolated from one another by a trench which extends between the first and second spaced apart layers of opposite conductivity type. Accordingly, SOI devices with differing conductivity buried layers may be provided.

In particular, SOI devices according to the present invention include a substrate and an insulating layer on the substrate. First and second spaced apart layers of opposite conductivity type are included on the insulating layer. An active layer is included on the first and second spaced apart layers. A trench extends through the active layer, between the first and second spaced apart layers of opposite conductivity type, and to the insulating layer. The trench preferably extends through the insulating layer and contacts the substrate. The trench is also preferably an insulating trench.

In particular, the trench may include a trench lining on the trench surface and a trench insulator in the trench, preferably filling the trench. The trench lining preferably comprises silicon dioxide and the trench insulator preferably comprises polycrystalline silicon. In such a lined trench embodiment, the trench insulator preferably contacts the substrate.

The present invention may also be regarded as an SOI device having a pedestal rather than a trench. In particular, the present invention may be regarded as an SOI device which includes a pedestal on a substrate such that the pedestal defines first and second spaced apart substrate regions. First and second insulating regions are included on the respective first and second spaced apart substrate regions. First and second regions of opposite conductivity type are included on the respective first and second insulating regions. Finally, first and second active regions are included on the respective first and second regions of opposite conductivity type. From this viewpoint, the trench lining may be viewed as a pedestal lining and the trench insulator may be regarded as a pedestal insulator.

SOI devices may be fabricated, according to method aspects of the present invention, by forming first and second semiconductor layers of opposite conductivity types, at a first face of a substrate. The first and second semiconductor layers may be formed in the substrate by implantation or may be formed on the substrate, for example by epitaxial growth. An insulating layer is formed on the first and second semiconductor layers of opposite conductivity types, for example by thermally oxidizing the first and second semiconductor layers of opposite conductivity types. A trench is formed through the insulating layer, extending between the first and second semiconductor layers of opposite conductivity type and extending into the substrate. A portion of the substrate is removed from a second substrate face which is opposite the first face, to thereby define first and second active regions on the first and second semiconductor layers of opposite conductivity type.

Preferably, a second substrate is bonded to the insulating layer between the steps of forming a trench and removing a portion of the substrate. Also preferably, when removing a portion of the substrate, the substrate is removed from the second face, until the trench is exposed. Thus, the thickness of the active regions may be defined by the depth of the trench.

As already described, the trench may be lined with insulating material and the trench may be filled with insulating material. In particular, the trench may be lined with oxide and then the lined trench may be filled with polysilicon. Accordingly, SOI devices having semiconductor layers of opposite conductivity types may be formed, with the semiconductor layers aligned to the trenches therebetween.

DETAILED DESCRIPTION OF PREFERRED EMBODIMENTS

Figure 1A:
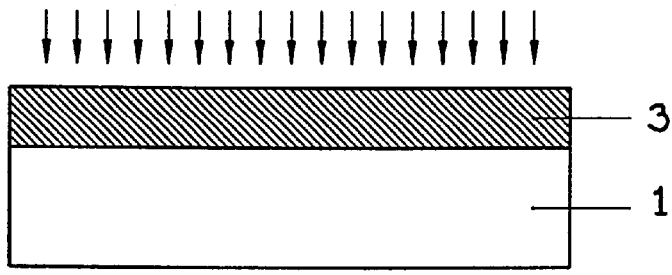
FIGS. 1A–1E are cross-sectional views illustrating a conventional SOI device during intermediate fabrication steps.
Figure 1B:
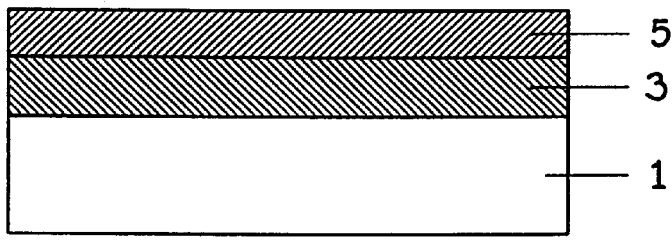
Figure 1C:
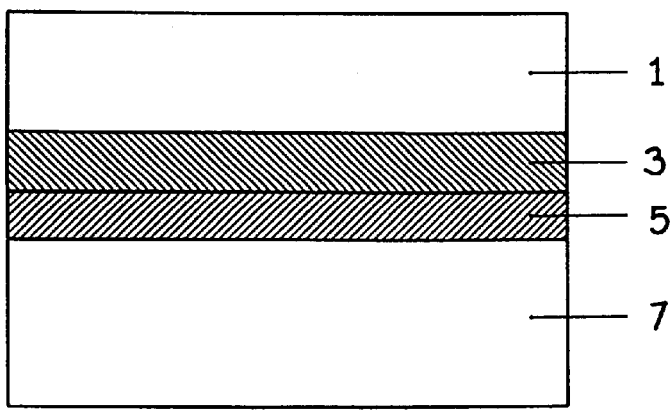
Figure 1D:
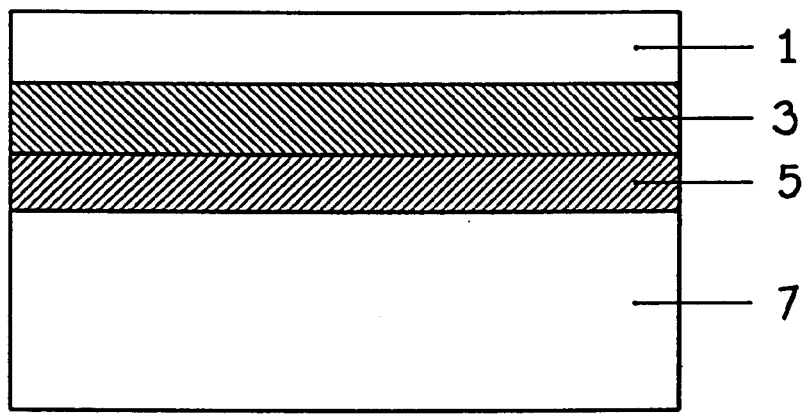
Figure 1E:
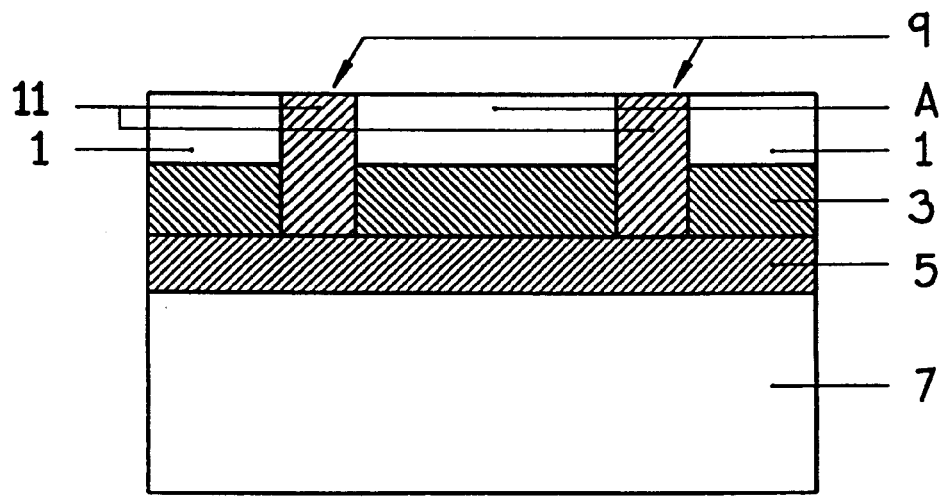

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 2A:
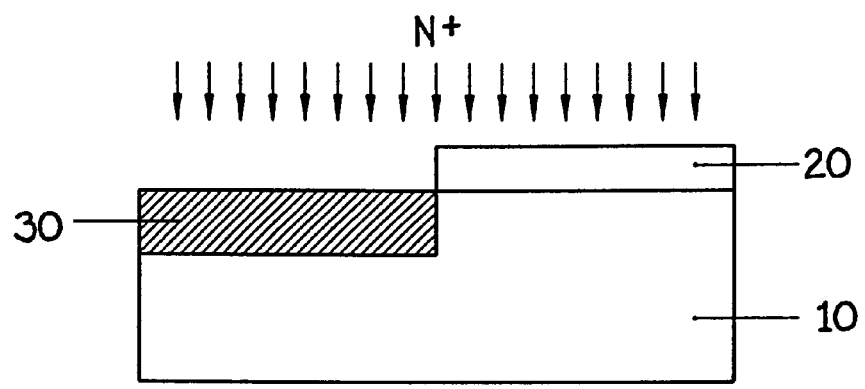
FIGS. 2A–2G are cross-sectional views illustrating SOI devices according to the present invention, during intermediate fabrication steps.
Figure 2B:
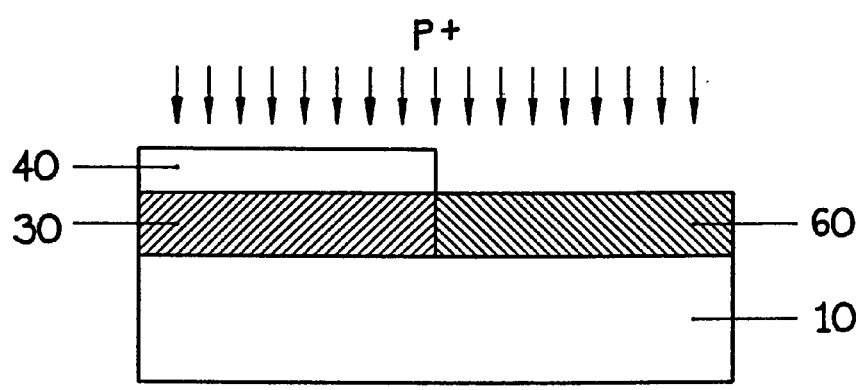

Referring now to FIGS. 2A–2G, methods of forming SOI devices according to the present invention will now be described. In particular, FIGS. 2A and 2B illustrate a step of forming first and second semiconductor layers of opposite conductivity types, at a first face of a substrate. In particular, as shown in FIG. 2A, a first oxide film is formed on a first face of a semiconductor substrate such as a silicon substrate 10 and a portion of the first oxide film is etched so that the remaining portion 20 of the first oxide film is used as a mask. N-type impurities are ion-implanted at high concentration and diffused into the substrate to form an N-type buried layer 30 of high doping concentration.

Then, as shown in FIG. 2B, the remaining portion 20 of the first oxide film is removed and a second oxide film is deposited. The second oxide film is patterned so that only a portion 40 of the second oxide film remains on the N-type buried layer 30. P-type dopants are then ion implanted and diffused at high concentration to form a P-type buried layer 60 of high concentration. As shown in FIG. 2B, the first and second semiconductor layers 30 and 60 of opposite conductivity types may abut one another. However, alternatively, they may be spaced apart from one another, and they may overlap as well.

Figure 2C:
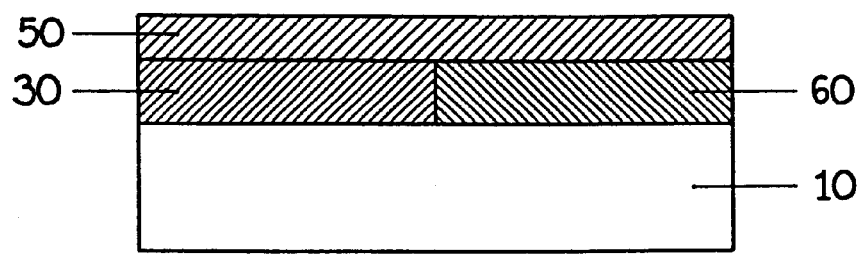

Referring now to FIG. 2C, the remaining portion 40 of the second oxide film is removed and a thermal oxide film 50 is formed on the first and second semiconductor layers of opposite conductivity types 30 and 60.

Figure 2D:
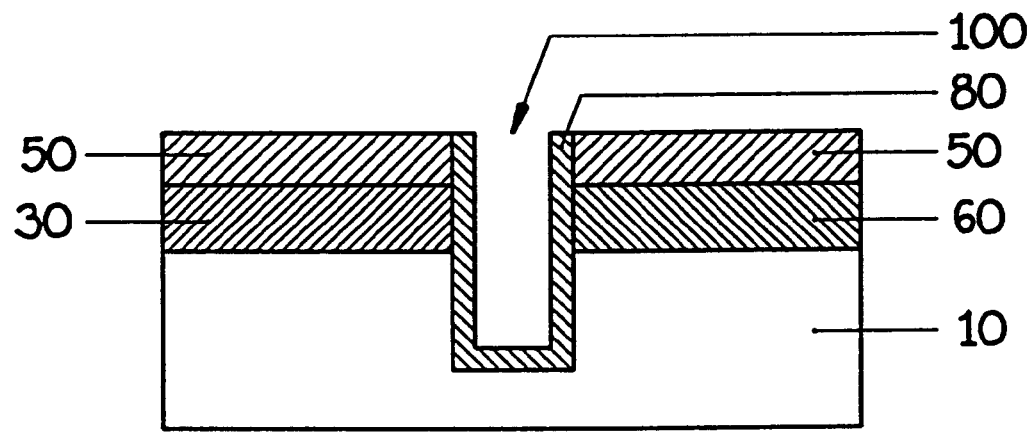

Referring now to FIG. 2D, the thermal oxide film 50 at the boundary of the N-type buried layer 30 and the P-type buried layer 60 is etched, for example using photolithography. Using the remaining thermal oxide film 50 as a mask, a trench 100 is formed, extending between the first and second semiconductor layers of opposite conductivity types 30 and 60.

As also shown in FIG. 2D, the trench extends into the substrate 10. The trench preferably extends into the substrate 10 so that the depth of the trench 100 can later be used as a grinding stop to determine the thickness of active SOI layers. As also shown in FIG. 2D, the surface of the trench is lined with insulating material, for example by thermally oxidizing the trench to form a thermal oxide film 80 on the surface of the trench.

Figure 2E:
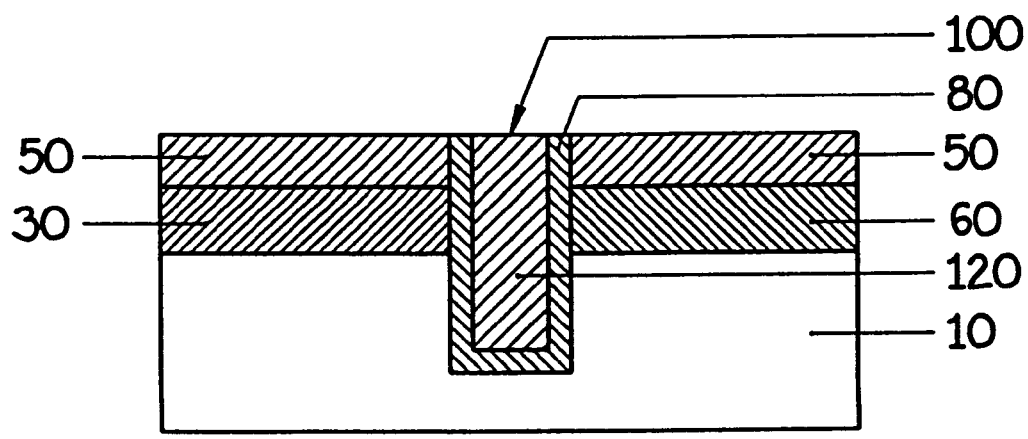

Referring now to FIG. 2E, a polycrystalline silicon layer 120 is then formed in the lined trench 100, preferably filling the trench 100. It will be understood that other insulating materials such as oxide may be used instead of the polycrystalline silicon layer 120.

Figure 2F:
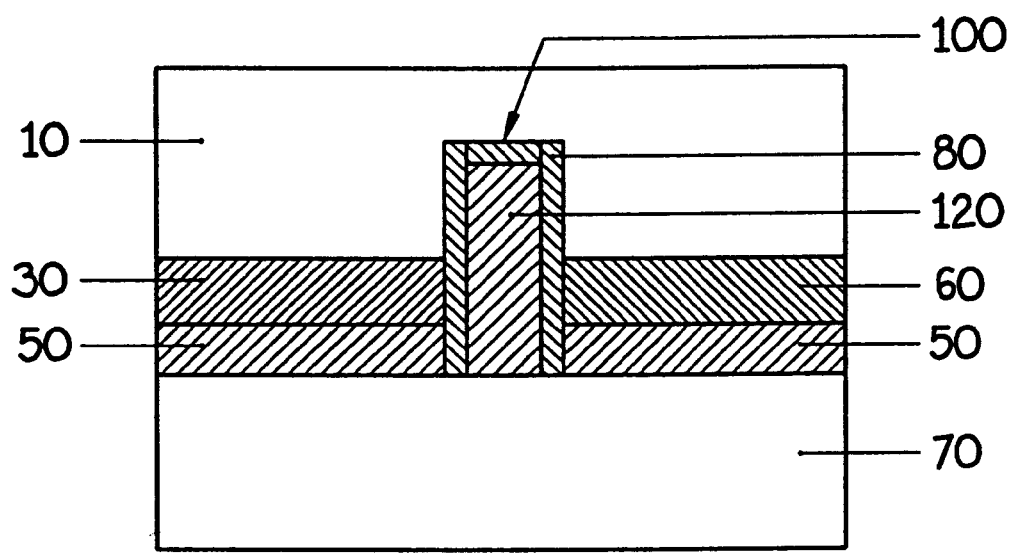

Referring now to FIG. 2F, a second substrate 70, which may or may not be a semiconductor substrate, is bonded to the thermal oxide film 50 and the polycrystalline silicon layer 120, using conventional techniques. For example, second substrate 70 may be an undoped silicon substrate.

Figure 2G:
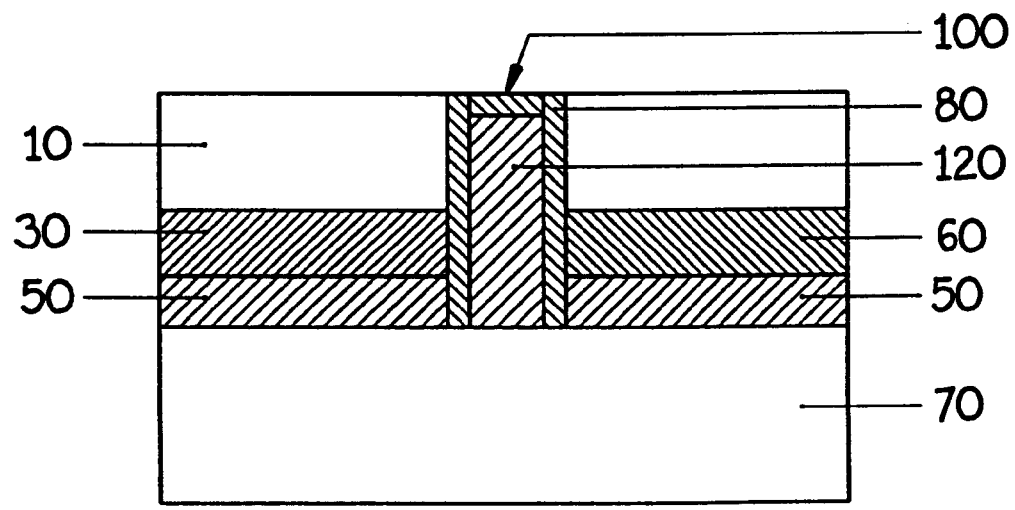

Referring now to FIG. 2G, a portion of the first substrate 10 is removed from the second face thereof which is opposite the first face, to define first and second active regions on the first and second semiconductor layers of opposite conductivity type 30 and 60. As shown in FIG. 2G, the portion of the substrate 10 is preferably removed until the surface of the thermal oxide film 80 which lines the trench 100 is exposed. The removal may be performed by grinding, etching, chemical-mechanical polishing or other conventional techniques. Accordingly, as shown in FIG. 2G, the thickness of the first substrate 10 may be determined by the thickness of the trench 100, regardless of the original thickness of the first substrate.

The semiconductor-on-insulator device of FIG. 2G may be regarded as including a substrate 70, an insulating layer 50 on the substrate, first and second spaced apart layers 30 and 60 of opposite conductivity type on the insulating layer 50, and an active layer 10 on the first and second spaced apart layers. A trench 100 extends through the active layer 10 between the first and second spaced apart layers of opposite conductivity type 30 and 60, and to the insulating layer 50. As shown, the trench can also extend through the insulating layer 50, to contact the substrate 70.

Alternatively, the semiconductor-on-insulator device of FIG. 2G may be regarded as a substrate 70, a pedestal 100 on the substrate, the pedestal defining first and second spaced apart regions in the substrate 70, to the left of pedestal 100 and to the right of pedestal 100, respectively. First and second insulating regions 50 are on the respective first and second space apart substrate regions, to the left of pedestal 100 and to the right of pedestal 100, respectively. First and second layers 30 and 60 respectively, of opposite conductivity type, are on the respective first and second insulating regions. First and second active regions 10 are on the respective first and second layers of opposite conductivity type 30 and 60. Accordingly, SOI devices may have different conductivity type buried layers and may use an exposed trench for alignment to form active regions having uniform thickness over the substrate.

Figure 3A:
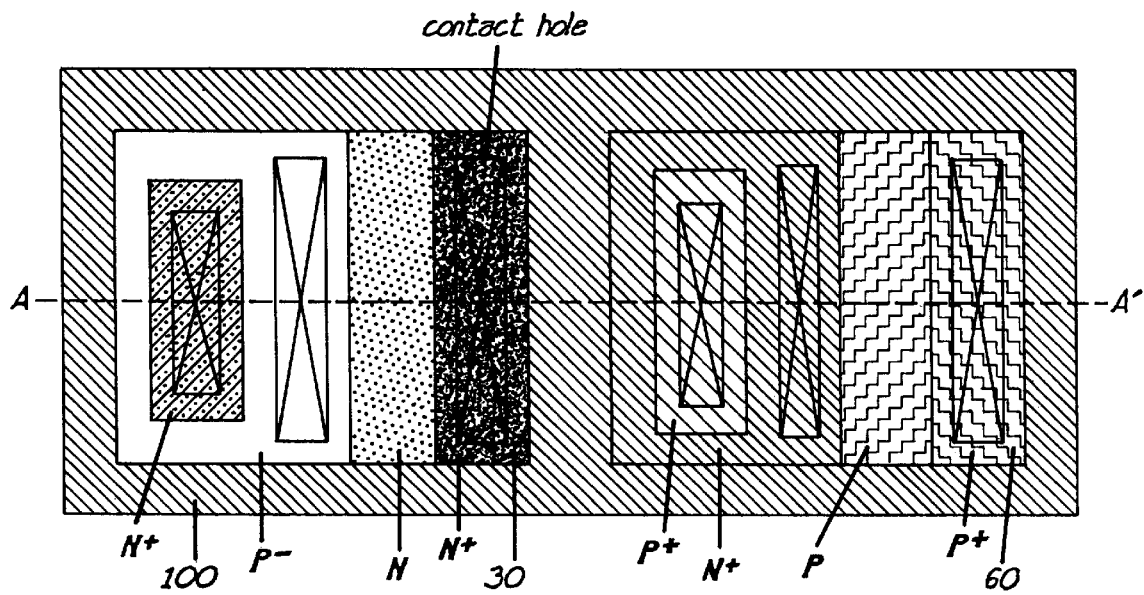
FIGS. 3A and 3B are a top view and a cross-sectional view respectively of SOI devices according to the invention including microelectronic devices in active regions thereof.
Figure 3B:
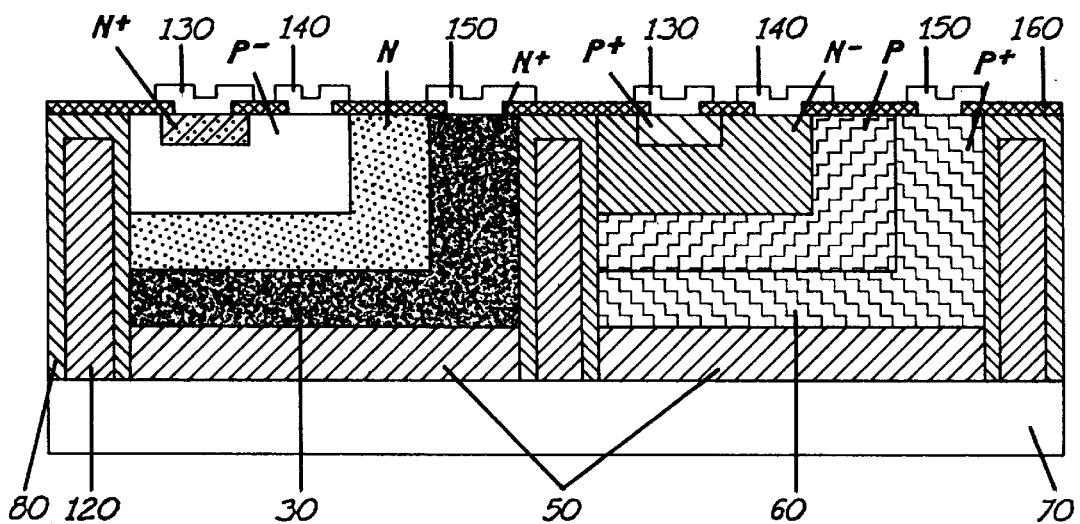

FIGS. 3A and 3B illustrate an example of complementary bipolar transistors which may be formed in SOI devices according to the present invention. It will be understood however, that other types of microelectronic devices, including but not limited to field effect transistors, diodes and the like may also be formed. As shown in FIGS. 3A and 3B, the active layer 10 at the left half of the drawings include an N-P-N bipolar transistor including an $N^+$ emitter, a $P^-$ base and a collector which includes an $N^+$ buried layer 30. Emitter, base and collector electrodes 130, 140 and 150 are also provided. These electrodes are insulated using an insulating layer 160, such as silicon dioxide.

At the right hand side of FIGS. 3A and 3B, a complementary P-N-P bipolar transistor is formed. This transistor includes a $P^+$ emitter, an $N^-$ base and a collector including a P region and a $P^+$ buried layer 60. Emitter, base and collector electrodes 130, 140 and 150 are also provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a semiconductor-on-insulator device, comprising the steps of:

forming first and second conductivity layers of opposite conductivity types, at a first face of a substrate;

forming an insulating layer on the first and second semiconductor layers of opposite conductivity type;

forming a trench through the insulating layer, extending between the first and second semiconductor layers of opposite conductivity type and extending in to the substrate; and bonding a second substrate to the insulating layer;

removing a portion of the substrate, from a second face which is opposite the first face to define respective first and second active regions on the respective first and second semiconductor layers of opposite conductivity type.

2. A method according to claim 1 wherein the step of removing a portion of the substrate comprises the step of: removing a portion of the substrate, from the second face, until the trench is exposed.

3. A method according to claim 1 wherein the following step is performed between the step of forming a trench and the step of removing a portion of the substrate:

lining the trench with insulating material.

4. A method according to claim 1 wherein the following step is performed between the step of forming a trench and the step of removing a portion of the substrate:

filling the trench with insulating material.

5. A method according to claim 4 wherein filling step comprises the steps of:

lining the trench with oxide; and filling the lined trench with polycrystalline silicon.

6. A method according to claim 1 wherein the step of forming an insulating layer comprises the step of:

thermally oxidizing the first and second semiconductor layers of opposite conductivity type.

7. A method according to claim 1 further comprising the step of forming at least one microelectronic device in the first and second active regions.

* * * * *